(12) United States Patent
Park et al.

(10) Patent No.: US 8,541,825 B2
(45) Date of Patent: Sep. 24, 2013

(54) IMAGE SENSOR WITH IMPROVED CHARGE TRANSFER EFFICIENCY AND METHOD FOR FABRICATING THE SAME

(75) Inventors: Jae-Young Park, Chungcheongbuk-do (KR); Youn-Sub Lim, Chungcheongbuk-do (KR)

(73) Assignee: Intellectual Ventures II LLC, Wilmington, DE (US)

( * ) Notice: Subject to any disclaimer, the term of this patent is extended or adjusted under 35 U.S.C. 154(b) by 10 days.

(21) Appl. No.: 12/011,433

(22) Filed: Jan. 25, 2008

(65) Prior Publication Data

US 2008/0197389 A1 Aug. 21, 2008

Related U.S. Application Data

(62) Division of application No. 11/192,851, filed on Jul. 28, 2005, now Pat. No. 7,344,964.

(30) Foreign Application Priority Data

Jul. 29, 2004 (KR) .............................. 2004-0059477

(51) Int. Cl.
*H01L 31/062* (2012.01)
(52) U.S. Cl.
USPC .................................. 257/292; 257/E31.001
(58) Field of Classification Search
USPC .................. 257/291, 292, 294, 443, 461, 465, 257/E27.131, E27.132, E27.133, E27.134
See application file for complete search history.

(56) References Cited

U.S. PATENT DOCUMENTS

| | | | | |
|---|---|---|---|---|
| 5,719,425 A | * | 2/1998 | Akram et al. | 257/344 |
| 5,847,428 A | * | 12/1998 | Fulford et al. | 257/344 |
| 5,929,483 A | * | 7/1999 | Kim et al. | 257/336 |
| 6,153,455 A | * | 11/2000 | Ling et al. | 438/231 |
| 6,207,984 B1 | * | 3/2001 | Chang | 257/291 |
| 6,372,591 B1 | | 4/2002 | Mineji et al. | 438/305 |
| 6,535,247 B1 | * | 3/2003 | Kozlowski et al. | 348/241 |
| 7,148,528 B2 | * | 12/2006 | Rhodes | 257/292 |
| 7,888,198 B1 | * | 2/2011 | Yang et al. | 438/231 |
| 2003/0141530 A1 | * | 7/2003 | Kaneko et al. | 257/299 |
| 2004/0094784 A1 | * | 5/2004 | Rhodes et al. | 257/292 |
| 2004/0104412 A1 | * | 6/2004 | Rhodes | 257/292 |
| 2004/0253761 A1 | * | 12/2004 | Rhodes et al. | 438/84 |
| 2005/0001248 A1 | * | 1/2005 | Rhodes | 257/292 |
| 2005/0139877 A1 | * | 6/2005 | Rhodes et al. | 257/292 |
| 2005/0148114 A1 | * | 7/2005 | Rhodes | 438/120 |
| 2006/0255382 A1 | * | 11/2006 | Rhodes | 257/292 |

* cited by examiner

*Primary Examiner* — Vongsavanh Sengdara
(74) *Attorney, Agent, or Firm* — McAndrews, Held & Malloy, Ltd.

(57) ABSTRACT

An image sensor includes: a first impurity region of the first conductive type aligned with one side of the gate structure and extending to a first depth from a surface portion of the semiconductor layer; a first spacer formed on each sidewall of the gate structure; a second impurity region of the first conductive type, aligned with the first spacer and extending to a second depth that is larger than the first depth from the surface portion of the semiconductor layer; a second spacer formed on each sidewall of the first spacer; a third impurity region of the first conductive type aligned with the second spacer and extending to a third depth that is larger than the second depth from the surface portion of the semiconductor layer; and a fourth impurity region of a second conductive type beneath the third impurity region.

18 Claims, 12 Drawing Sheets

US 8,541,825 B2

IMAGE SENSOR WITH IMPROVED CHARGE TRANSFER EFFICIENCY AND METHOD FOR FABRICATING THE SAME

The present patent application is a Divisional of application Ser. No. 11/192,851, filed Jul. 28, 2005 now U.S. Pat. No. 7,344,964.

FIELD OF THE INVENTION

The present invention relates to an image sensor and a method for fabricating the same; and, more particularly, to an image sensor with improved charge transfer efficiency and a method for fabricating the same.

DESCRIPTION OF RELATED ARTS

Image sensors are semiconductor devices that convert an optical image into an electrical signal. Examples of such image sensors are charge coupled devices (CCDs) and complementary metal-oxide-semiconductor (CMOS) image sensors.

CCDs are devices where charge carriers transferred from metal-oxide-semiconductor (MOS) capacitors are stored into the MOS capacitors closely allocated around the CCDs. On the other hand, CMOS image sensors take a switching mode that sequentially detects outputs by using MOS transistors fabricated in the same number of pixels via CMOS technology using a control circuit and a signal processing circuit as a peripheral circuit. Particularly, CMOS image sensors have been widely used in portable photographing devices due to advantages of CMOS image sensors such as the large-scale of integration and low driving voltage.

Meanwhile, one important characteristic of CMOS image sensors is a dead zone characteristic, which is closely related to a quality of an image in low brightness. Also, as CMOS technology has been developed, sizes of pixels have proportionally decreased, and thus, sizes of photodiodes, which are photo-response regions, are also reduced. The decreased driving voltage may become one cause of degraded quality of an image in low brightness. Therefore, a photodiode of an image sensor needs to have a structure that can improve charge transfer efficiency. Especially, it is generally essential to obtain a photodiode structure optimized for conditions of low power voltage and low field.

FIG. 1 is a cross-sectional view showing a part of a unit pixel of a conventional image sensor.

As shown in FIG. 1, a plurality of device isolation regions 12 are formed locally in a bottom structure including a highly doped $p^{++}$-type substrate 10 and a p-epi layer 11. Hereinafter, the bottom structure is referred to as a semiconductor layer. A gate structure, more specifically, a transfer gate Tx in a CMOS image sensor with a pixel structure of 4 transistors, is formed on the semiconductor layer. The gate structure includes a conductive layer 14 and an insulation layer 13, and spacers 16 are formed on sidewalls of the gate structure. By performing an ion implantation process, a photodiode PD is formed in a predetermined portion of the semiconductor layer aligned with one side of the gate structure, i.e., the transfer gate Tx. The photodiode PD includes a p-type impurity region 17 (hereinafter referred to as a p0 region) and an n-type impurity region 15 (hereinafter referred to as an $n^-$ region). A floating diffusion (FD) region 18 is formed in a predetermined portion of the semiconductor layer aligned with the other side of the transfer gate Tx by implanting highly doped $n^+$-type impurities. The conductive layer 14 is formed in a single layer of polysilicon or tungsten silicide or in a stack structure thereof. The spacers 16 are formed by using nitride, oxide or oxynitride.

The unit pixel having the above described structure as shown in FIG. 1 should be capable of transferring electrons generated from the photodiode PD to the floating diffusion region FD. Therefore, the $n^-$ region 15 of the photodiode PD is made to contact the transfer gate Tx, so that a fringing field applied on the $n^-$ region 15 of the photodiode PD increases when charges are transferred by applying a power voltage to the transfer gate Tx. The increasing fringing field results in an easier attraction and transfer of charges from the $n^-$ region 15.

As shown in FIG. 1, the $n^-$ region 15 is aligned with one side of the transfer gate Tx, and in this case, a potential barrier is generated between the $n^-$ region 15 and a channel of the transfer gate Tx because of diffusion in the p0 region 17. This potential barrier impedes the charge transfer, thereby decreasing the charge transfer efficiency. Also, the potential barrier causes a generation of electrons that are not transferred to the floating diffusion region 18 and as a result, characteristics of an image sensor may become degraded.

In an attempt to overcome this disadvantage, a profile of the p0-type impurity region is changed to change a potential distribution of the photodiode.

FIG. 2A is a cross-sectional view showing a part of a unit pixel of another conventional image sensor. It should be noted that the same reference numerals are used for the same configuration elements described in FIG. 1 and thus, detailed description of such elements will be omitted.

In FIG. 2A, the p0 region shown in FIG. 1 is divided into a first p01 region 15 and a second p02 region 18. The first p01 region 15 is formed to be aligned with one side of a transfer gate Tx by performing an ion implantation process prior to forming spacers 17. The second p02 region 18 is formed such that a profile of the selected spacer 17 is transcribed at a bottom portion of a semiconductor layer by performing an ion implantation process after forming the spacers 17. Therefore, because of this specific alignment of the first p01 region 15 and the second p02 region 18, the p0 region has an indentation where the p0 region is aligned with the selected spacer 17.

FIG. 2B is a diagram briefly showing a potential distribution caused by the indented p0 region shown in FIG. 2A.

As shown, the potential has a stepped distribution and thus, electrons can be transferred more easily compared with the previous conventional image sensor.

FIG. 3 shows graphs portraying a potential distribution and a concentration distribution in a conventional image sensor.

In FIG. 3, concentrations of a photodiode PD, a gate structure, more particularly, a transfer gate Tx, and a floating diffusion region FD are expressed in a logarithmic scale, and the potential distribution with respect to the photodiode PD, the transfer gate Tx and the floating diffusion region FD is shown below the concentration distribution. Especially, a potential gradient does not appear at a region marked with 'A'.

FIG. 4 is a graph showing a two-dimensional top view of a potential distribution and a concentration distribution of a conventional image sensor.

As shown in FIG. 4, the potential distribution between an edge region and a central region of a photodiode PD is discontinuous as indicated by reference denotations 'C' and 'E'.

FIG. 5 is a graph showing a two-dimensional cross-sectional view of a potential distribution and a concentration distribution of a conventional image sensor.

In FIG. 5, the potential distribution between an edge region and a central region of a photodiode PD is discontinuous as shown by a reference denotation 'G'.

However, even in the latter described conventional image sensor, the charge transfer efficiency may still be limited due to a current trend in low voltage and micronization of image sensors.

SUMMARY OF THE INVENTION

It is, therefore, an object of the present invention to provide an image sensor with improved charge transfer efficiency and a method for fabricating the same.

In accordance with an aspect of the present invention, there is provided an image sensor, including: a gate structure on a semiconductor layer of a first conductive type; a first impurity region of the first conductive type aligned with one side of the gate structure and extending to a first depth from a surface portion of the semiconductor layer; a first spacer formed on each sidewall of the gate structure; a second impurity region of the first conductive type, aligned with the first spacer and extending to a second depth that is larger than the first depth from the surface portion of the semiconductor layer; a second spacer formed on each sidewall of the first spacer; a third impurity region of the first conductive type aligned with the second spacer and extending to a third depth that is larger than the second depth from the surface portion of the semiconductor layer; and a fourth impurity region of a second conductive type beneath the third impurity region.

In accordance with another aspect of the present invention, there is provided an image sensor, including: a gate structure on a semiconductor layer of a first conductive type; a first impurity region of the first conductive type aligned with one side of the gate structure and extending to a first depth from a surface portion of the semiconductor layer; a spacer formed on each sidewall of the gate structure; a second impurity region of the first conductive type aligned with the spacer and extending to a second depth that is larger than the first depth from the surface portion of the semiconductor layer; a screening insulation layer formed over the spacer and the semiconductor layer; a third impurity region of the first conductive type aligned with an upper structure where the spacer is overlaid with the screening insulation layer and extending to a third depth that is larger than the second depth from the surface portion of the semiconductor layer; and a fourth impurity region of a second conductive type beneath the third impurity region.

In accordance with still another aspect of the present invention, there is provided a method for fabricating an image sensor, including: forming a gate structure on a semiconductor layer of a first conductive type; performing a first ion implantation process to form a first impurity region of the first conductive type aligned with one side of the gate structure and extending to a first depth from a surface of the semiconductor layer; forming a first spacer on each sidewall of the gate structure; performing a second ion implantation process to form a second impurity region of the first conductive type aligned with the first spacer and extending to a second depth that is larger than the first depth from the surface of the semiconductor layer; forming a second spacer on each sidewall of the first spacer; performing a third ion implantation process to form a third impurity region aligned with the second spacer and extending to a third depth that is larger than the second depth from the surface portion of the semiconductor layer; and performing a fourth ion implantation process to form a fourth impurity region of a second conductive type beneath the third impurity region.

In accordance with a further aspect of the present invention, there is provided a method for fabricating an image sensor, including: forming a gate structure on a semiconductor layer of a first conductive type; performing a first ion implantation process to form a first impurity region of the first conductive type aligned with one side of the gate structure and extending to a first depth from a surface portion of the semiconductor layer; forming a spacer on each sidewall of the gate structure; performing a second ion implantation process to form a second impurity region of the first conductive type aligned with the spacer and extending to a second depth that is larger than the first depth from the surface portion of the semiconductor layer; forming a screening insulation layer over the spacer and the semiconductor layer; performing a third ion implantation process to form a third impurity region of the first conductive type aligned with an upper structure where the spacer is overlaid with the screening insulation layer and extending to a third depth that is larger than the second depth from the surface portion of the semiconductor layer; and performing a forth ion implantation process to form a fourth impurity region of a second conductive type beneath the third impurity region.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

An image sensor with improved charge transfer efficiency and a method for fabricating the same in accordance with embodiments of the present invention will be described in detail with reference to the accompanying drawings.

Figure 6:
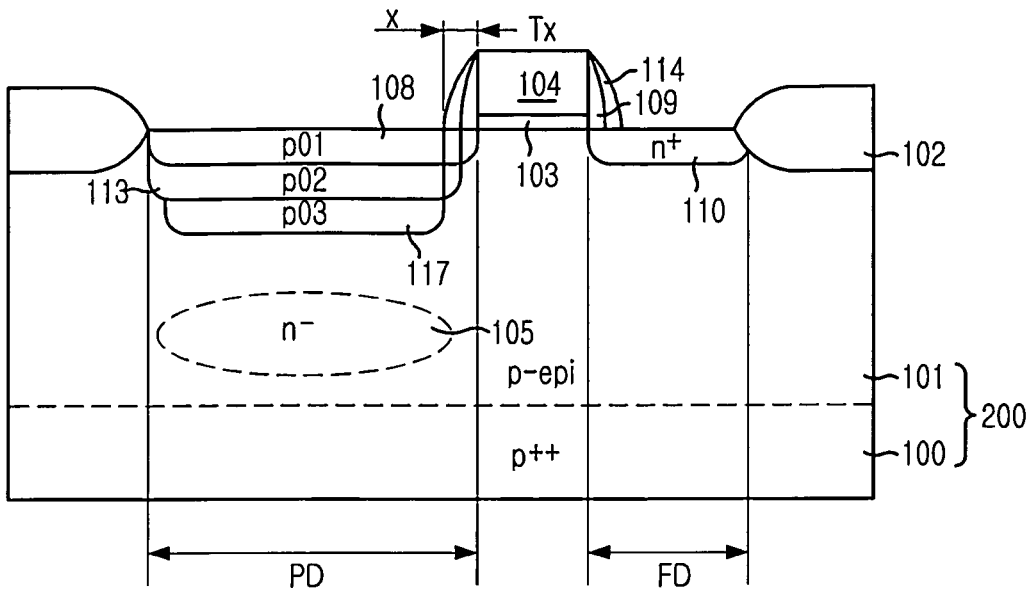
FIG. 6 is a cross-sectional view showing a part of a unit pixel of an image sensor in accordance with a first embodiment of the present invention.

FIG. 6 is a cross-sectional view showing a part of a unit pixel of an image sensor in accordance with a first embodiment of the present invention.

As shown, the image sensor includes: a gate structure, more specifically, a transfer gate Tx, formed on a p-type semiconductor layer 200; a first p-type impurity (p01) region 108; a pair of first spacers 109 formed on sidewalls of the transfer gate Tx; a second p-type impurity (p02) region 113; a pair of second spacers 114 formed on sidewalls of the first spacers 109; a third p-type impurity (p03) region 117; and an n⁻-type impurity region 105 for use in a photodiode.

The p-type semiconductor layer 200 includes a highly doped p⁺⁺-type substrate 100 and a p-epi layer 101. The gate structure includes a gate insulation layer 103 and a conductive layer 104.

The first p-type impurity (p01) region 108 extends to a first depth from a surface of the semiconductor layer 200 as being aligned with one side of the transfer gate Tx. The second p-type impurity (p02) region 113 extends to a second depth that is greater than the first depth from the surface of the semiconductor layer 200 as being aligned with one of the first spacers 109. The third p-type impurity (p03) region 117 extends to a third depth that is greater than the second depth from the surface of the semiconductor layer 200 as being aligned with one of the second spacers 114. By performing an ion implantation process, the n⁻-type impurity region 105 is formed inside a portion of the semiconductor layer 200 beneath the third p-type impurity (p03) region 117. The first p-type impurity (p01) region 108, the second p-type impurity (p02) region 113, the third p-type impurity (p03) region 117, and the n⁻-type impurity region 105 construct a photodiode PD in the form of a pn junction.

Also, the image sensor further includes: a highly doped n⁺-type floating diffusion (FD) region 110; and a plurality of device isolation regions 102. The highly doped n⁺-type floating diffusion region 110, which senses photo-charges generated at the photodiode PD and then transferred as the transfer gate Tx is turned on, faces to the photodiode PD by having the transfer gate Tx in between the photodiode PD and the highly doped n⁺-type floating diffusion (FD) region 110. Also, the highly doped n⁺-type floating diffusion (FD) region 110 extends to a certain depth from the surface of the semiconductor layer 200 and is aligned with the other side of the transfer gate Tx. The device isolation regions 102 are formed in edge sides of the photodiode PD and the highly doped n⁺-type floating diffusion (FD) region 110.

Meanwhile, by adjusting a thickness of the second spacers 114, a distance 'X' from each sidewall of the transfer gate Tx can be adjusted as well. As a result, a profile of the third p-type impurity (p03) region 117 having the same shape as that of the second spacers 114 can be changed as well.

Figure 7:
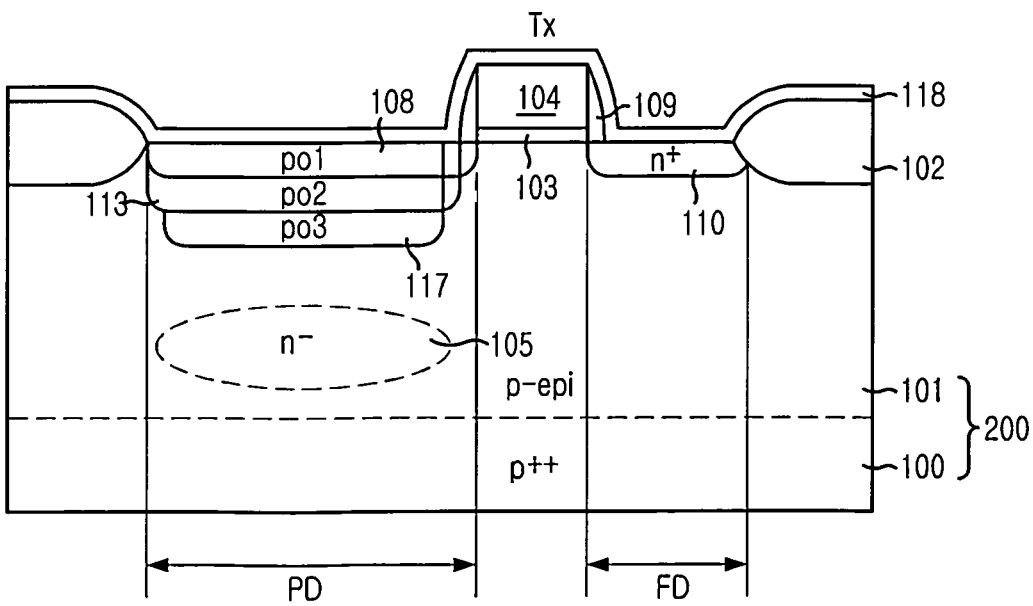
FIG. 7 is a cross-sectional view showing a part of a unit pixel of an image sensor in accordance with a second embodiment of the present invention.

FIG. 7 is a cross-sectional view showing a part of a unit pixel of an image sensor in accordance with a second embodiment of the present invention. Herein, it should be noted that the same reference numerals are used for the same configuration elements described in FIG. 6 and thus, detailed description of such configuration elements will be omitted.

As shown in FIG. 7, the image sensor includes: a gate structure, more specifically, a transfer gate Tx, formed on a p-type semiconductor layer 200; a highly doped n⁺-type floating diffusion (FD) region 110; a plurality of device isolation regions 102; a first p-type impurity (p01) region 108; a pair of first spacers 109 formed on sidewalls of the transfer gate Tx; a second p-type impurity (p02) region 113; a screening insulation layer 118; a third p-type impurity (p03) region 117; and an n⁻-type impurity region 105 for use in a photodiode.

The first p-type impurity (p01) region 108 extends to a first depth from a surface of the semiconductor layer 200 as being aligned with one side of the transfer gate Tx. The second p-type impurity (p02) region 113 extends to a second depth that is greater than the first depth from the surface of the semiconductor layer 200 as being aligned with one of the first spacers 109. The screening insulation layer 118 is formed over an entire surface of the semiconductor layer 200 including the above described configuration elements and, has a thickness ranging from approximately 500 Å to approximately 1,000 Å. The third p-type impurity (p03) region 117 extends to a third depth greater than the second depth from the surface of the semiconductor layer 200 as being aligned with an upper structure obtained as the first spacers 109 are overlaid with the screening insulation layer 118. By performing an ion implantation process, the n⁻-type impurity region 105 is formed in a portion of the semiconductor layer 200 beneath the third p-type impurity (p03) region 117.

Figure 1:
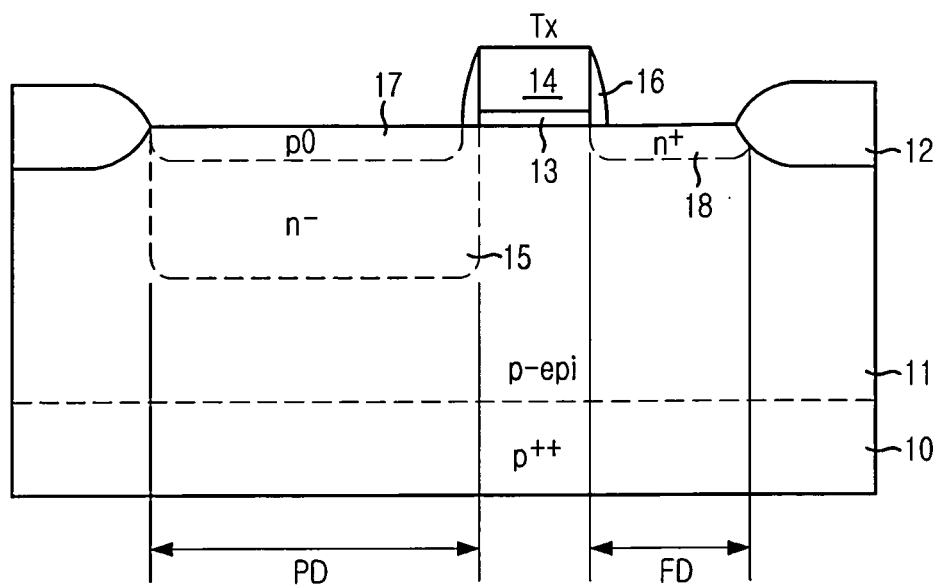
FIG. 1 is a cross-sectional view showing a part of a unit pixel of a conventional image sensor.
Figure 2A:
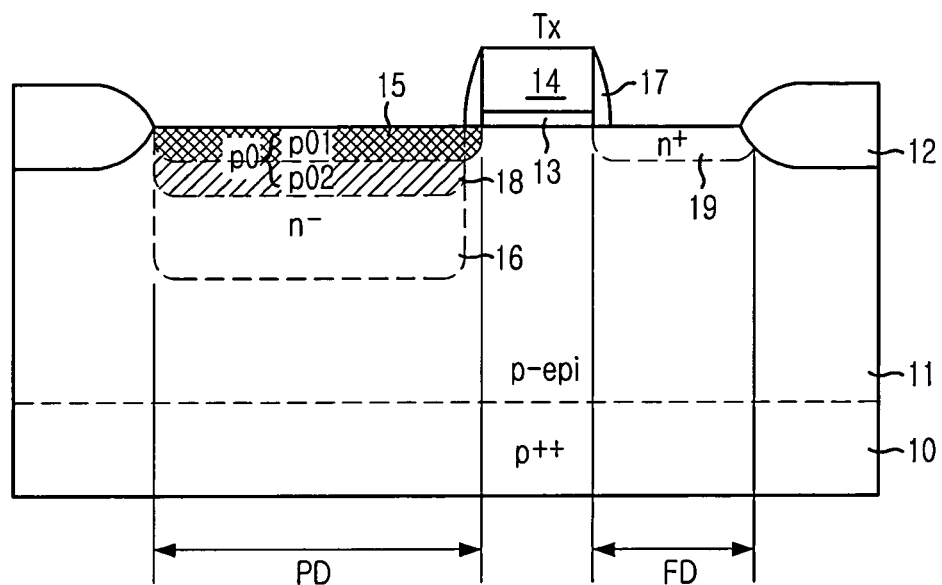
FIG. 2A is a cross-sectional view showing a part of a unit pixel of another conventional image sensor.
Figure 2B:
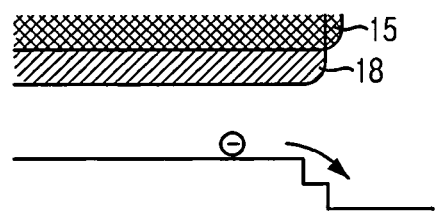
FIG. 2B is a diagram briefly showing a potential distribution of a p-type impurity region depicted in FIG. 2A.
Figure 3:
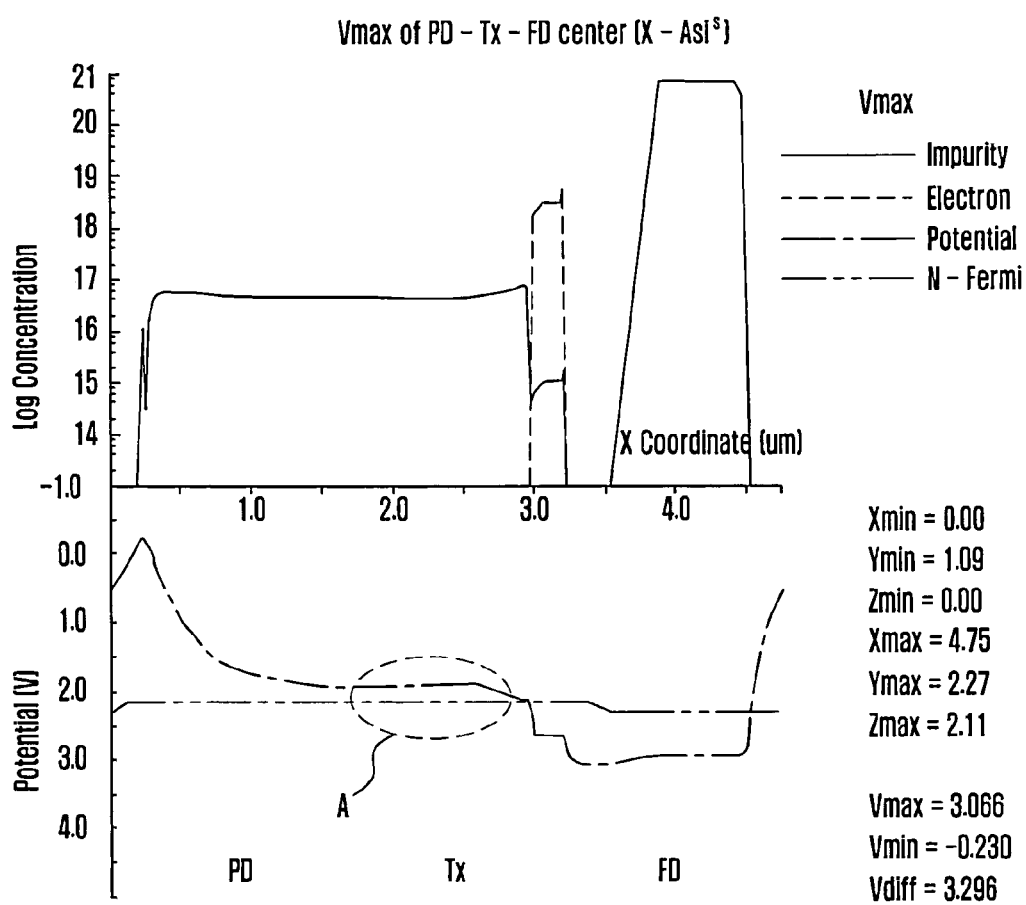
FIG. 3 shows graphs portraying a potential distribution and a concentration distribution in a conventional image sensor.
Figure 8:
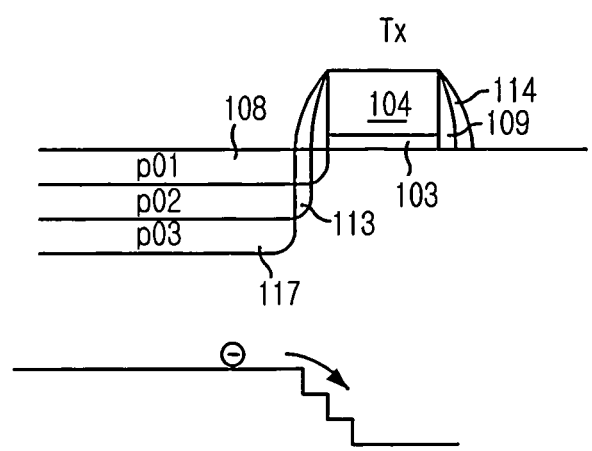
FIG. 8 is a diagram showing a potential distribution of a p-type impurity region of a photodiode depicted in FIG. 6.

FIG. 8 is a diagram showing a potential distribution of a p-type impurity (p0) region including the first to the third p-type impurity regions 108, 113 and 117 in the photodiode PD region shown in FIG. 3.

As shown in FIG. 8, the first p-type impurity region 108, the second p-type impurity region 113 and the third p-type impurity region 117 are aligned beneath a portion of the semiconductor layer 200 such that the first to the third p-type impurity regions 108, 113 and 117 are disposed with different distances from the transfer gate Tx. Thus, the potential distribution of the p-type impurity (p0) region exhibits the steeply stepped distribution in which the potential decreases as close to the transfer gate Tx. Hence, photo-generated charges at the photodiode PD are actively transferred in a direction of an arrow, thereby increasing charge transfer efficiency.

Hereinafter, a method for fabricating the above described image sensor is described in detail.

Figure 9A:
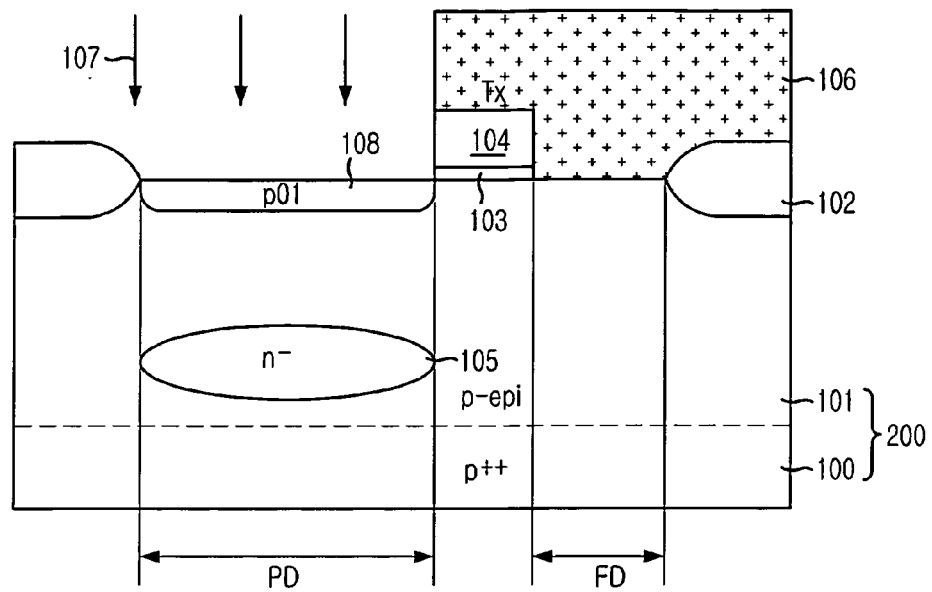
FIGS. 9A to 9C are cross-sectional views of an image sensor fabricated according to an embodiment of the present invention for illustrating a method for fabricating the same.
Figure 9B:
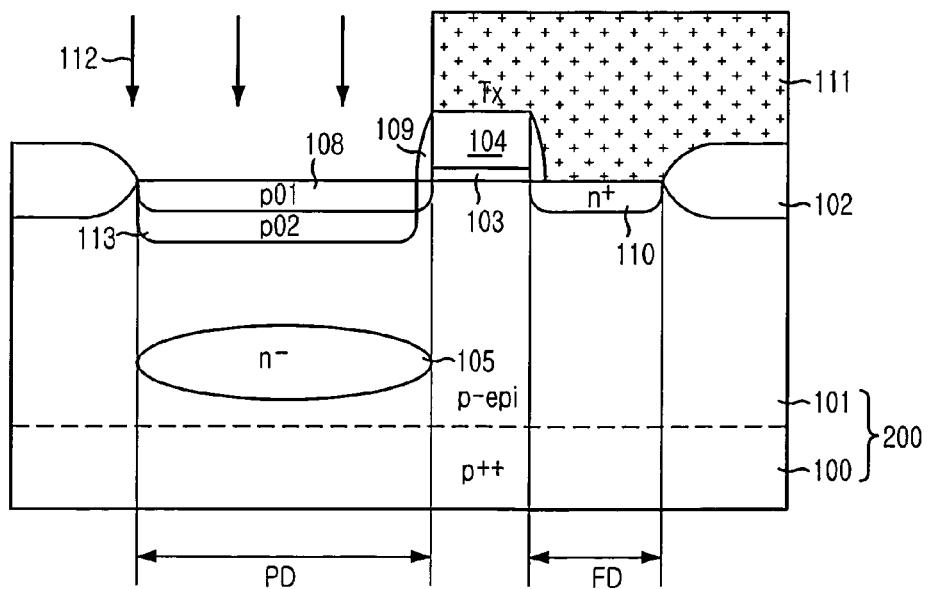
Figure 9C:
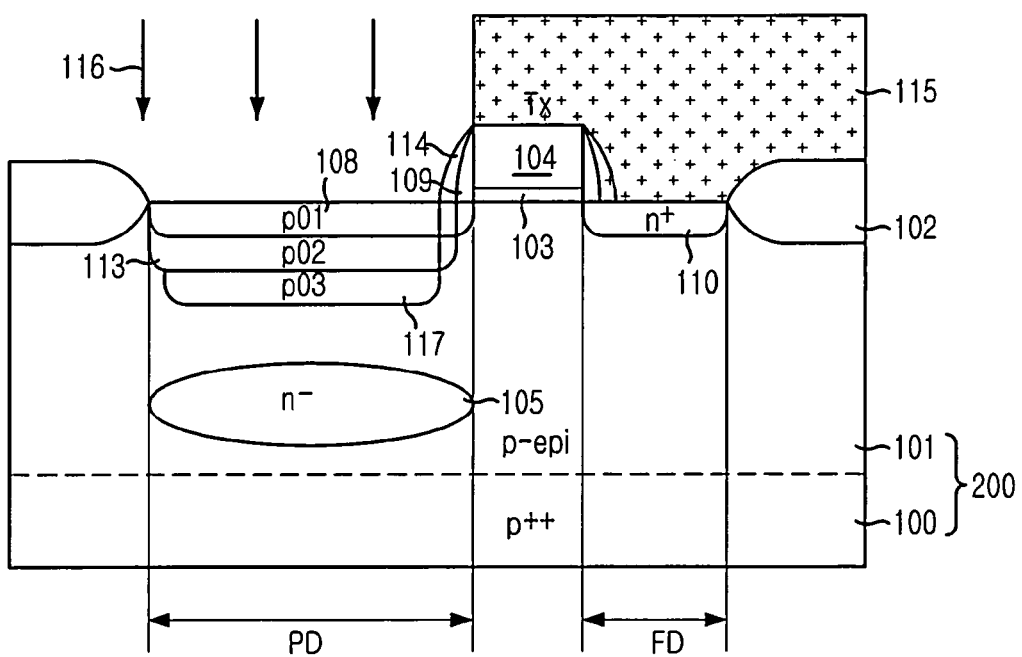

FIGS. 9A to 9C are cross-sectional views illustrating a method for fabricating an image sensor in accordance with the first embodiment of the present invention. Herein, it should be noted that the same reference numerals are used for the same configuration elements described in FIG. 6.

Referring to FIG. 9A, by performing a shallow trench isolation (STI) method or a local oxidation of silicon (LOCOS) method, a plurality of device isolation regions 102 are formed in a p-type semiconductor layer 200 including a highly doped p⁺⁺-type substrate 100 and a p-epi layer 101. Then, an insulation layer 103 and a conductive layer 104 are deposited on the semiconductor layer 200 and patterned to form a gate structure, more specifically, a transfer gate Tx. The conductive layer 104 includes a material selected alone or in combination from a group consisting of polysilicon, tungsten and tungsten silicide.

A first ion implantation mask 106 is formed and, an ion implantation process is performed in alignment with one side of the transfer gate Tx. From the ion implantation process, an n⁻-type impurity region 105 for use in a photodiode is formed. Although a screening layer for protecting a surface of the semiconductor layer 200 against the ion implantation process is used, the screening layer is not illustrated in FIG. 9A for the sake of simplification. The ion implantation process uses a typically implemented concentration of an impurity, and an energy level of the ion implantation process is adjusted to obtain a deep doping profile for the n⁻-type impurity region 105.

Next, another ion implantation process is performed in alignment with the transfer gate Tx, thereby obtaining a first p-type impurity (p01) region 108 extending from a surface of the semiconductor layer 200. The first ion implantation mask 106 is removed thereafter. A reference numeral 107 denotes said another ion implantation process which will be referred to as a first ion implantation process hereinafter.

Referring to FIG. 9B, although not illustrated, an insulation layer for forming first spacers 109 is formed over the gate structure, i.e., the transfer gate Tx and then, subjected to an etch-back process to form the first spacers 109 on sidewalls of the transfer gate Tx. The insulation layer is an oxide-based or nitride-based layer.

Afterwards, an ion implantation process is performed in alignment with the other side of the transfer gate Tx to form n-type and p-type source/drain regions. A floating diffusion (FD) region 110 aligned with the other side of the transfer gate Tx is formed by implanting $n^+$-type impurities.

A second ion implantation mask 111 is formed exposing regions where a second p-type impurity (p02) region 113 will be formed and then, an ion implantation process is performed in alignment with one of the first spacers 109 to form the aforementioned second p-type impurity (p02) region 113. A reference numeral 112 denotes the ion implantation process for forming the second p-type impurity (p02) region 113 and, this ion implantation process will be referred to as a second ion implantation process hereinafter.

Compared with the first p-type impurity (p01) region 108, the second p-type impurity (p02) region 113 is apart from the transfer gate Tx as much as a thickness of the first spacers 109 and is formed to be deeper than the first p-type impurity (p01) region 108. Therefore, the first p-type impurity (p01) region 108 and the second p-type impurity (p02) region 113 have an indented region because of a profile created by the first spacers 109. The second ion implantation mask 111 is removed thereafter.

Referring to FIG. 9C, although not illustrated, another insulation layer is formed over the above resulting substrate structure and then, an etch-back process is performed on said another insulation layer to form second spacers 114 on sidewalls of the first spacers 109. The insulation layer for forming the second spacers 114 includes an oxide-based material or a nitride-based material.

A third ion implantation mask 115 is formed exposing a region where a third p-type impurity (p03) region 117 will be formed. Then, an ion implantation process is performed in alignment with the second spacers 114 to form the aforementioned third p-type impurity (p03) region 117. A reference numeral 116 denotes this ion implantation process which will be referred to as a third ion implantation process hereinafter. Compared with the first p-type impurity (p01) region 108, the p-type impurity (p03) region 117 is apart from the transfer gate Tx as much as a total thickness of the first spacers 109 and the second spacers 114 and is formed to be deeper than the second p-type impurity (p02) region 117. Therefore, the first p-type impurity (p01) region 108, the second p-type impurity (p02) region 113 and the third p-type impurity (p03) region 117 have a triple indentation structure because of profiles created by the first spacers 109 and the second spacers 114.

The thickness of the second spacers 114 can change a profile of the third p-type impurity (p03) region 117. The insulation layer for forming the second spacers 114 has a thickness ranging from approximately 3,000 Å to approximately 5,000 Å. The etch-back process for forming the second spacers 114 is performed until a remaining thickness of the insulation layer for forming the second spacers 114 ranges preferably from approximately 500 Å to approximately 1,000 Å.

As for the image sensor shown in FIG. 7, the same processes described in FIGS. 9A through 9C are selectively performed to form the elements described in FIG. 7. Then, the screening insulation layer 108 formed in a thickness of approximately 500 Å to approximately 1,000 Å, which is relatively thin, so that the screening insulation layer 108, which is not removed, can be used for the insulation purpose. The screening insulation layer 108 is an oxide-based layer.

Figure 10:
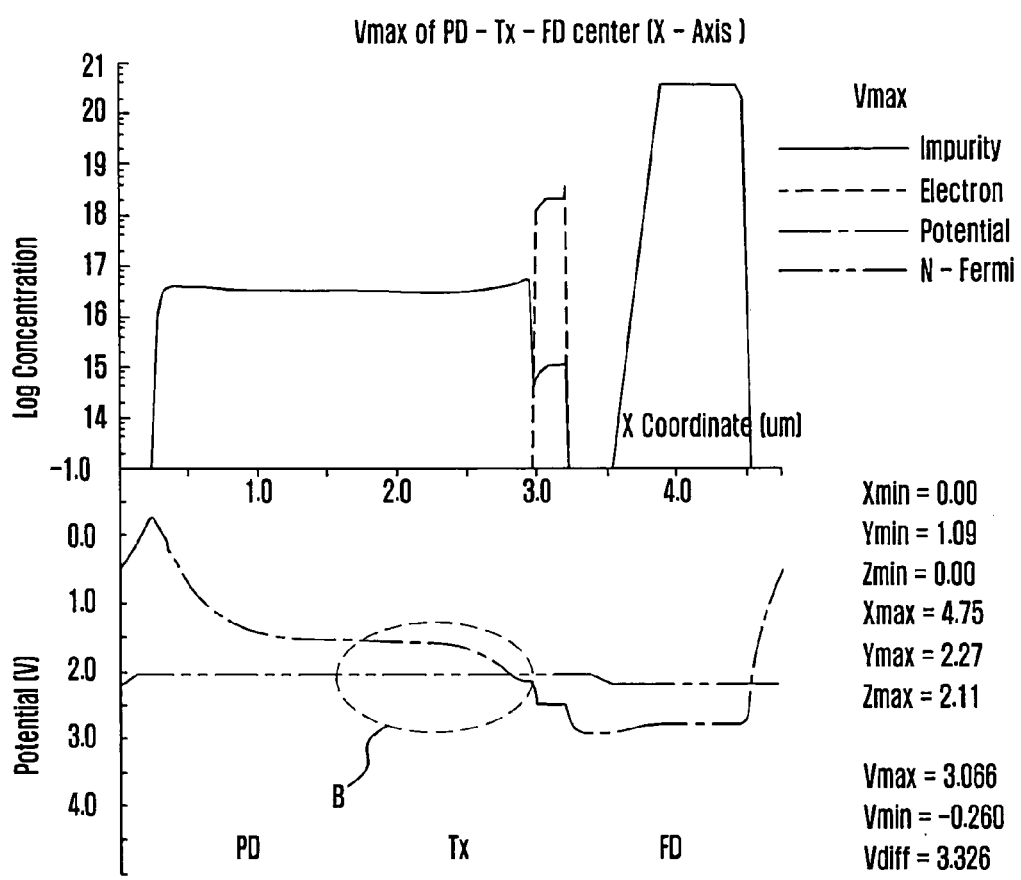
FIG. 10 is a graph showing a potential distribution and a concentration distribution of an image sensor in accordance with an embodiment of the present invention.

FIG. 10 is a graph showing a potential distribution and a concentration distribution of an image sensor in accordance with a specific embodiment of the present invention.

As illustrated in FIG. 10, concentrations of a photodiode PD, a gate electrode, more particularly, a transfer gate Tx, and a floating diffusion region FD are expressed in a logarithmic scale, and the potential distribution with respect to the photodiode, the transfer gate and the floating diffusion region FD is shown below the concentration distribution. As for the concentration distribution, since the concentration is expressed in a logarithmic scale, the concentration distribution shown in FIG. 10 does not exhibit a distinct difference from the concentration distribution shown in FIG. 3. In contrast, the potential distribution shown in FIG. 10 is different from the potential distribution shown in FIG. 3. For instance, as shown in FIG. 3, a potential gradient of the conventional image sensor does not appear at a region marked with 'A'. However, the image sensor according to the specific embodiment of the present invention has a potential gradient at a region marked with 'B' due to triply implemented ion implantation processes.

Figure 11:
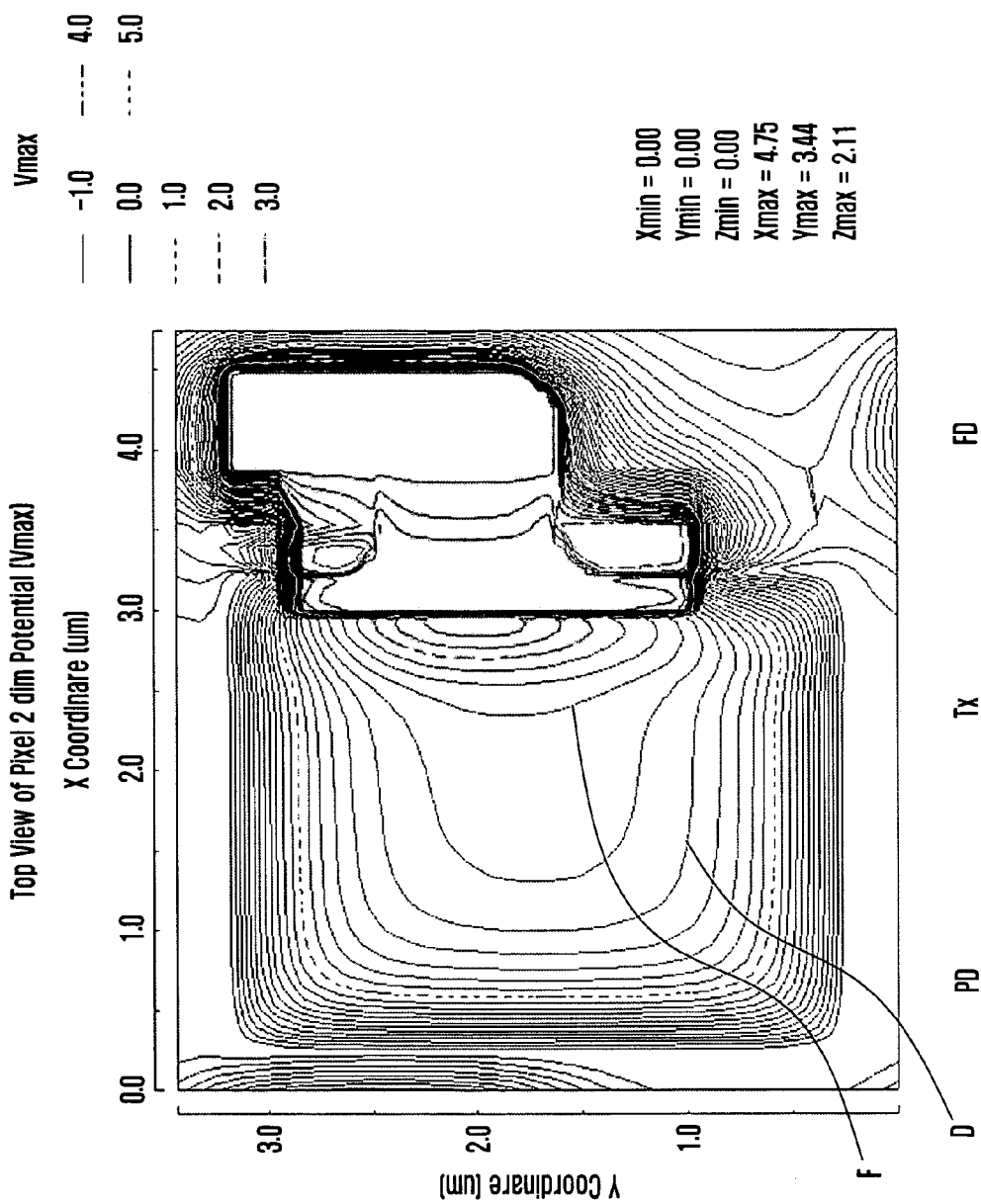
FIG. 11 is a graph showing a two-dimensional top view of a potential distribution and a concentration distribution of an image sensor in accordance with an embodiment of the present invention.

FIG. 11 is a graph showing a two-dimensional top view of a potential distribution and a concentration distribution of an image sensor in accordance with another specific embodiment of the present invention.

Figure 4:
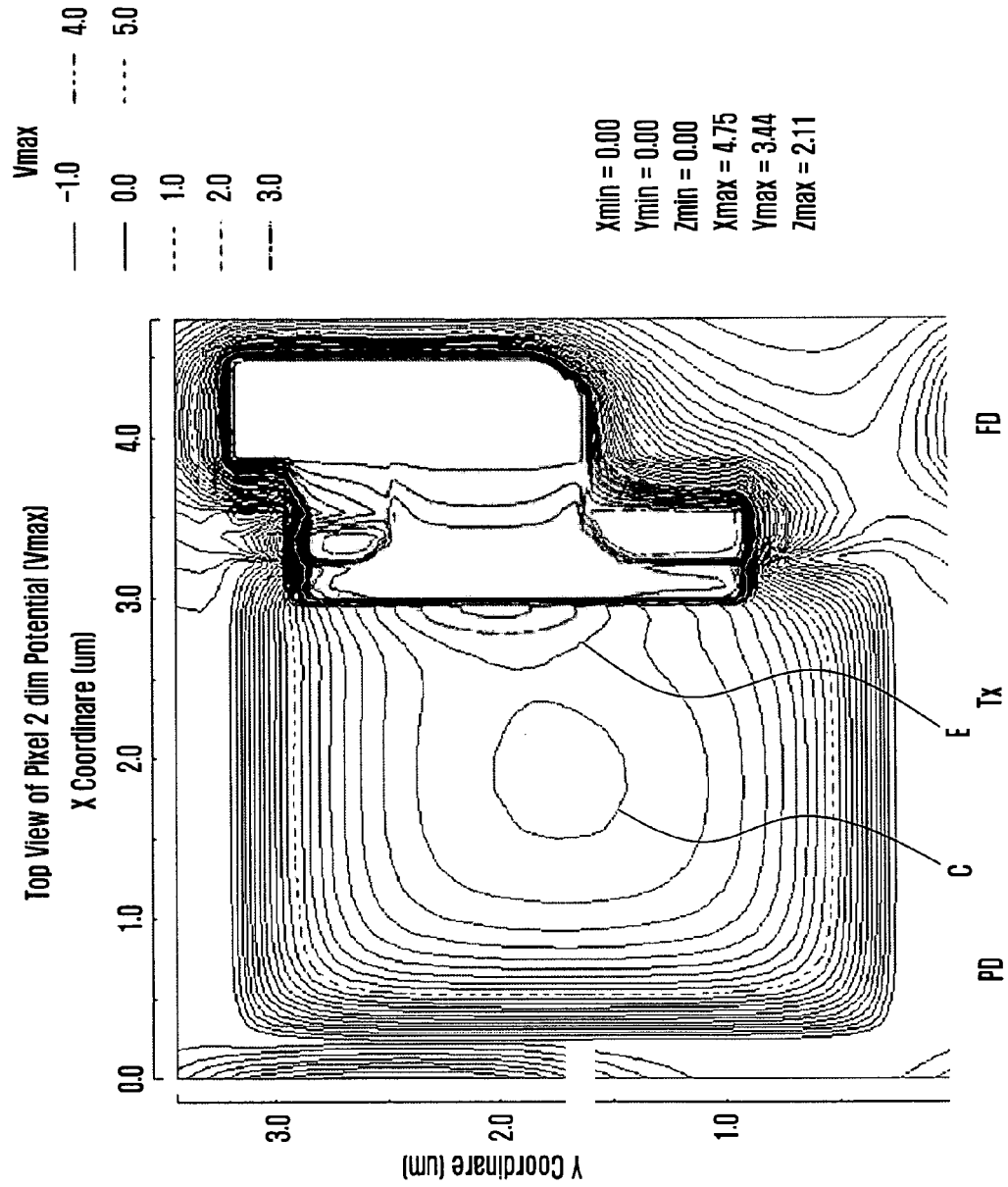
FIG. 4 is a graph showing a two-dimensional top view of a potential distribution and a concentration distribution of a conventional image sensor.

Compared with the potential distribution and the concentration distribution of the conventional image sensor shown in FIG. 4, a potential gradient is uniform at an edge region and a central region of a photodiode (PD) as indicated by reference denotations 'D' and 'F'.

Figure 12:
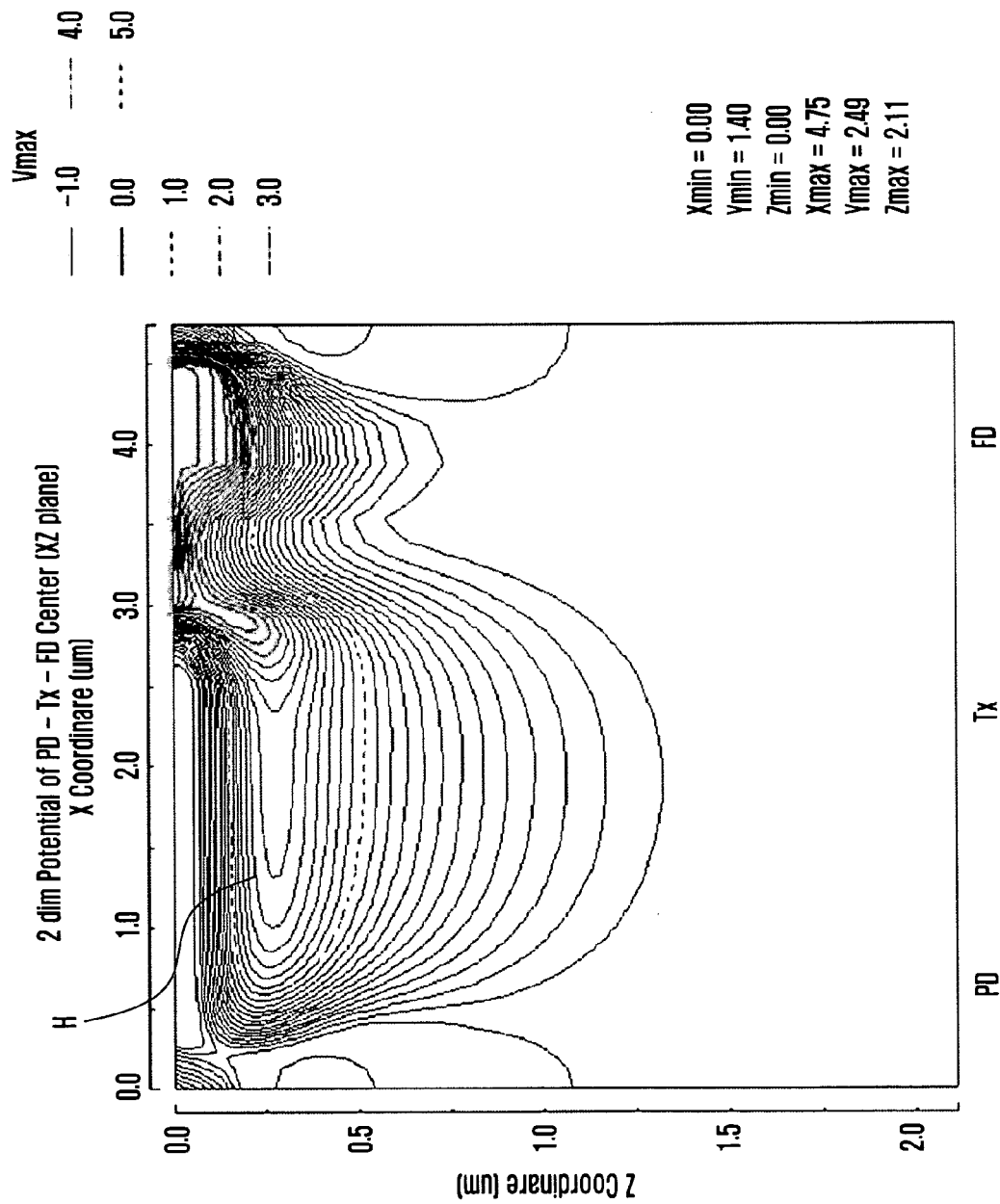
FIG. 12 is a graph showing a two-dimensional cross-sectional view of a potential distribution and a concentration distribution of an image sensor in accordance with an embodiment of the present invention.

FIG. 12 is a graph showing a two-dimensional cross-sectional view of a potential distribution and a concentration distribution of an image sensor in accordance with a further specific embodiment of the present invention.

Figure 5:
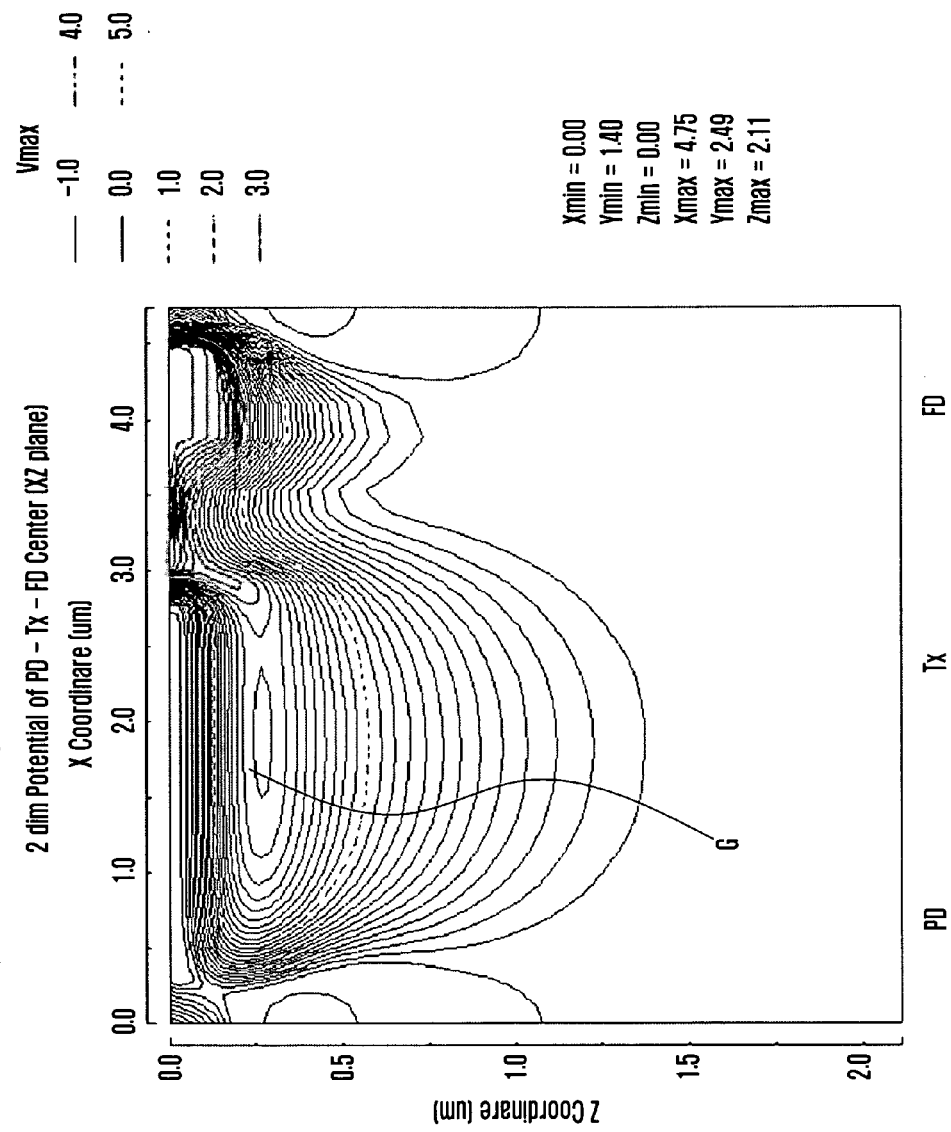
FIG. 5 is a graph showing a two-dimensional cross-sectional view of a potential distribution and a concentration distribution of a conventional image sensor.

Compared with the potential distribution shown in FIG. 5, the potential distribution between an edge region and a central region of a photodiode PD is continuous as indicated by a reference denotation 'H'.

In accordance with one embodiment of the present invention, a dual spacer structure is formed on sidewalls of a transfer gate and, an ion implantation process is performed three times, i.e., before forming first spacers and second spacers, after forming first spacers and after forming second spacers. The shapes of the first spacers and the second spacers are transcribed to predetermined portions of a semiconductor layer through triply implemented ion implantation processes and as a result, the whole p-type impurity region has indented regions.

In accordance with another embodiment of the present invention, an ion implantation process is performed in alignment with a gate structure. After a single spacer structure is formed, another ion implantation process is performed transcribing the shape of the single spacer structure to a predetermined portion of a semiconductor layer. Then, a thin screening insulation layer is formed and, a further another ion implantation process is performed in alignment with the screening oxide layer. As a result of the triply implemented ion implantation processes, a p-type impurity region has a triple structure.

Both the former described embodiment and the latter described embodiment of the present invention provide the triple structure of the p-type impurity region, which improves charge transfer efficiency. The charge transfer efficiency contributes to an enhancement of image sensor functions.

The present application contains subject matter related to the Korean patent application No. KR 2004-59477, filed in the Korean Patent Office on Jul. 29, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. An image sensor, comprising:
a gate structure formed on a semiconductor layer of a first conductive type;
a first impurity region of the first conductive type aligned with one side of the gate structure and extending from a surface portion of the semiconductor layer to a first depth;
a second impurity region of the first conductive type, extending from the surface portion of the semiconductor layer to a second depth that is deeper than the first depth;
a third impurity region of the first conductive type extending from the surface portion of the semiconductor layer to a third depth that is deeper than the second depth;
a fourth impurity region of a second conductive type beneath the third impurity region; and
a floating diffusion region of the second conductive type aligned with the other side of the gate structure and extending to a predetermined depth from another surface portion of the semiconductor layer;
wherein the second conductive type is different than the first conductive type;
wherein the first impurity region, the second impurity region, the third impurity region, and the fourth impurity region form a photodiode of the image sensor; and
wherein the gate is configured to transfer charge collected by the photodiode to the floating diffusion region in response to a control signal.

2. The image sensor of claim 1, further comprising a first spacer formed on each sidewall of the gate structure.

3. The image sensor of claim 2, further comprising a screening insulation later formed over the first spacer and the semiconductor layer.

4. The image sensor of claim 3, wherein the screening insulation layer is formed over an entire surface of the semiconductor layer.

5. The image sensor of claim 2, further comprising a second spacer formed on each sidewall of the first spacer.

6. The image sensor of claim 1, wherein the first, second and third impurity regions are each p-type impurity regions, and wherein the fourth impurity region is an n-type impurity region.

7. The image sensor of claim 1, wherein the entirety of the fourth impurity region is deeper than the third impurity region.

8. An image sensor, comprising:
a gate structure formed on a semiconductor layer, wherein the semiconductor layer includes a substrate and an epitaxial layer of a first conductive type formed on the substrate;
a first impurity region of the first conductive type aligned with one side of the gate structure and extending from a surface portion of the epitaxial layer to a first depth in the epitaxial layer;
a first spacer formed on each sidewall of the gate structure;
a second impurity region of the first conductive type, aligned with the first spacer and extending from the surface portion of the epitaxial layer to a second depth in the epitaxial layer that is deeper than the first depth;
a second spacer formed on each sidewall of the first spacer;
a third impurity region of the first conductive type aligned with the second spacer and extending from the surface portion of the epitaxial layer to a third depth in the epitaxial layer that is deeper than the second depth; and
a fourth impurity region of a second conductive type in the epitaxial layer and beneath the third impurity region;
wherein:
the entirety of the fourth impurity region is deeper in the epitaxial layer than the third impurity region;
the second conductive type is different than the first conductive type; and
the first impurity region, the second impurity region, the third impurity region, and the fourth impurity region form a photodiode of the image sensor.

9. The image sensor of claim 8, wherein the second spacer has a thickness ranging from approximately 500 Å to approximately 1,000 Å.

10. The image sensor of claim 8, wherein the first spacer and the second spacer comprise an oxide-based material or a nitride-based material.

11. The image sensor of claim 8, further comprising a floating diffusion region of the second conductive type aligned with the other side of the gate structure and extending to a predetermined depth from another surface portion of the epitaxial layer.

12. The image sensor of claim 8, wherein the substrate comprises a highly-doped first conductive type substrate.

13. The image sensor of claim 8, wherein the first, second and third impurity regions are each p-type impurity regions, and wherein the fourth impurity region is an n-type impurity region.

14. An image sensor, comprising:
a gate structure formed on a semiconductor layer, wherein the semiconductor layer includes a substrate and an epitaxial layer of a first conductive type formed on the substrate;
a first impurity region of the first conductive type aligned with one side of the gate structure and extending from a surface portion of the epitaxial layer to a first depth in the epitaxial layer;
a first spacer formed on each sidewall of the gate structure;
a second impurity region of the first conductive type, aligned with the first spacer and extending from the surface portion of the epitaxial layer to a second depth in the epitaxial layer that is deeper than the first depth;
a second spacer formed on each sidewall of the first spacer;
a third impurity region of the first conductive type aligned with the second spacer and extending from the surface portion of the epitaxial layer to a third depth in the epitaxial layer that is deeper than the second depth;
a fourth impurity region of a second conductive type in the epitaxial layer and beneath the third impurity region; and
a floating diffusion region of the second conductive type aligned with the other side of the gate structure and extending to a predetermined depth from another surface portion of the epitaxial layer;

wherein:
the entirety of the fourth impurity region is deeper in the epitaxial layer than the third impurity region;
the second conductive type is different than the first conductive type;
the first impurity region, the second impurity region, the third impurity region, and the fourth impurity region form a photodiode of the image sensor; and
the gate is configured to transfer charge collected by the photodiode to the floating diffusion region in response to a control signal.

15. The image sensor of claim 14, wherein the substrate comprises a highly-doped first conductive type substrate.

16. The image sensor of claim 14, wherein the first, second and third impurity regions are each p-type impurity regions, and wherein the fourth impurity region is an n-type impurity region.

17. The image sensor of claim 14, wherein the second spacer has a thickness ranging from approximately 500 Å to approximately 1,000 Å.

18. The image sensor of claim 14, wherein the first spacer and the second spacer comprise an oxide-based material or a nitride-based material.

* * * * *

UNITED STATES PATENT AND TRADEMARK OFFICE
CERTIFICATE OF CORRECTION

| | | |
|---|---|---|
| PATENT NO. | : 8,541,825 B2 | Page 1 of 1 |
| APPLICATION NO. | : 12/011433 | |
| DATED | : September 24, 2013 | |
| INVENTOR(S) | : Park et al. | |

It is certified that error appears in the above-identified patent and that said Letters Patent is hereby corrected as shown below:

In the Drawings:

In Fig. 4, Sheet 4 of 12, delete "X Coordinare" and insert -- X Coordinate --, therefor.

In Fig. 4, Sheet 4 of 12, delete "Y Coordinare" and insert -- Y Coordinate --, therefor.

In Fig. 5, Sheet 5 of 12, delete "X Coordinare" and insert -- X Coordinate --, therefor.

In Fig. 5, Sheet 5 of 12, delete "Z Coordinare" and insert -- Z Coordinate --, therefor.

In Fig. 7, Sheet 6 of 12, delete "$\overline{po1}/\overline{po2}/\overline{po3}$" and insert -- $\overline{p01}/\overline{p02}/\overline{p03}$ --, therefor.

In Fig. 11, Sheet 11 of 12, delete "X Coordinare" and insert -- X Coordinate --, therefor.

In Fig. 11, Sheet 11 of 12, delete "Y Coordinare" and insert -- Y Coordinate --, therefor.

In Fig. 12, Sheet 12 of 12, delete "X Coordinare" and insert -- X Coordinate --, therefor.

In Fig. 12, Sheet 12 of 12, delete "Z Coordinare" and insert -- Z Coordinate --, therefor.

In the Specification:

In Column 1, Line 6, delete "2005" and insert -- 2005, --, therefor.

In Column 4, Line 17, delete "forth ion" and insert -- fourth ion --, therefor.

In Column 7, Line 56, delete "(p02) region 117." and insert -- (p02) region 113. --, therefor.

In the Claims:

In Column 9, Line 49, in Claim 3, delete "screening insulation later" and insert -- screening insulation layer --, therefor.

Signed and Sealed this
Fifteenth Day of April, 2014

Michelle K. Lee
*Deputy Director of the United States Patent and Trademark Office*